US006481426B1

(12) United States Patent
McChesney et al.

(10) Patent No.: US 6,481,426 B1
(45) Date of Patent: Nov. 19, 2002

(54) LOW SIGNATURE EMI/RFI ENGINE

(75) Inventors: Richard M. McChesney, Waukegan, IL (US); Matthew L. Bridge, Pleasant Prairie, WI (US)

(73) Assignee: Bombardier Motor Corporation of America, Grant, FL (US)

( * ) Notice: Subject to any disclaimer, the term of this patent is extended or adjusted under 35 U.S.C. 154(b) by 0 days.

(21) Appl. No.: 09/723,863

(22) Filed: Nov. 28, 2000

(51) Int. Cl.[7] .......................... H05K 9/00; F02P 11/00
(52) U.S. Cl. .............................. 123/633; 174/355 M
(58) Field of Search ............................ 123/633, 298; 174/355 M, 35 TS, 104

(56) References Cited

U.S. PATENT DOCUMENTS 2,322,773 A * 6/1943 Peters ..................... 123/633
2,446,387 A * 8/1948 Peterson .................. 174/104
4,234,759 A * 11/1980 Harlow ..................... 174/104
4,327,702 A * 5/1982 Imai et al. ................. 123/633
4,757,297 A * 7/1988 Frawley ................. 174/35 SM
4,875,457 A * 10/1989 Fitzner ..................... 123/633
5,194,838 A * 3/1993 Cobo ........................ 333/243
5,359,981 A * 11/1994 Kim .......................... 123/633
5,789,797 A * 8/1998 Ikuta et al. ................ 257/533
5,970,945 A * 10/1999 Holtermann ............... 123/259

* cited by examiner

*Primary Examiner*—Erick Solis
(74) *Attorney, Agent, or Firm*—Fletcher, Yoder & Van Someren

(57) ABSTRACT

An engine system having a low EMI/RFI signature. The system comprises a two-stroke engine having a cylinder with a piston sized for reciprocal motion through the cylinder. The two-stroke engine further includes an injector deployed in communication with the combustion chamber to discharge a fuel into the combustion chamber. An electronic control unit controls the injection and ignition for the engine, and an EMI/RFI reduction system is utilized to lower the electromagnetic and radio frequency interference signature of the engine.

23 Claims, 8 Drawing Sheets

LOW SIGNATURE EMI/RFI ENGINE

FIELD OF THE INVENTION

The present invention relates generally to an internal combustion engine, and particularly to a two-stroke engine that utilizes a system for lowering the electromagnetic and radio frequency interference signature.

BACKGROUND OF THE INVENTION

Internal combustion engines generally have one or more cylinders through which one or more pistons move in a reciprocating manner. Each piston is connected to a crankshaft by a connecting rod able to deliver force from the piston to the crankshaft to rotate the crankshaft. Power to drive the piston is provided by igniting a fuel-air mixture disposed in the cylinder on a side of the piston opposite the connecting rod. The fuel-air mixture is ignited by some type of ignition device, such as a spark plug.

Internal combustion engines typically utilize a variety of conductors, e.g. wires, for carrying various electronic signals. For example, an electronic control unit may receive a variety of signals from various sensors and output a variety of signals to, for example, an injection system and an ignition system. The ignition system also utilizes a variety of electric signals, including electric signals provided to the one or more spark plugs used to ignite a fuel/air mixture disposed in the combustion chamber. Typically, such electric signals provide an electromagnetic and radio frequency signature that can cause unwanted interference. In certain applications, it would be advantageous to reduce the electromagnetic interference and radio frequency interference produced by the electronics of the engine.

SUMMARY OF THE INVENTION

According to one aspect of the present invention, a low signature engine system is provided to reduce electromagnetic interference (EMI) and radio frequency interference (RFI). The system includes a two-stroke engine. The engine has a combustion chamber and an injector deployed in communication with the combustion chamber to discharge a fuel thereto. Additionally, the engine includes an electronic control unit in communication with the injector to control the discharge of fuel. Also, an EMI/RFI reduction system is used to lower the electromagnetic and radio frequency interference signature of a plurality of conductors utilized by the two-stroke engine during operation.

According to another aspect of the present invention, a method is provided for reducing the electromagnetic and radio frequency signature of an engine having a plurality of electrical conductors. The method comprises placing at least some of the plurality of electrical conductors into a bundle. The bundle is surrounded with a conductive layer. Additionally, a conductive strip is deployed intermediate the bundle and the conductive layer. The conductive strip is then grounded to reduce the EMI/RFI signature.

According to another aspect of the present invention, a method is provided for making an engine having a reduced electromagnetic and radio frequency signature. The method includes providing a two-stroke engine having a combustion chamber. The method further includes injecting a fuel directly into the combustion chamber during operation. Additionally, the method comprises limiting the electromagnetic and radio frequency interference by providing an EMI/RFI barrier around a plurality of electrical conductors.

BRIEF DESCRIPTION OF THE DRAWINGS

The invention will hereafter be described with reference to the accompanying drawings, wherein like reference numerals denote like elements, and.

DETAILED DESCRIPTION OF THE PREFERRED EMBODIMENTS

The present technique for utilizing a plurality of fuel types in an internal combustion engine can be used in a variety of engines and environments. For the sake of clarity and explanation, however, the invention is described in conjunction with a cross scavenged engine that operates on a two-stroke cycle and powers a watercraft. The exemplary embodiment described herein should not be construed as limiting, however, and has potential uses in other types of engines and applications.

Figure 1:
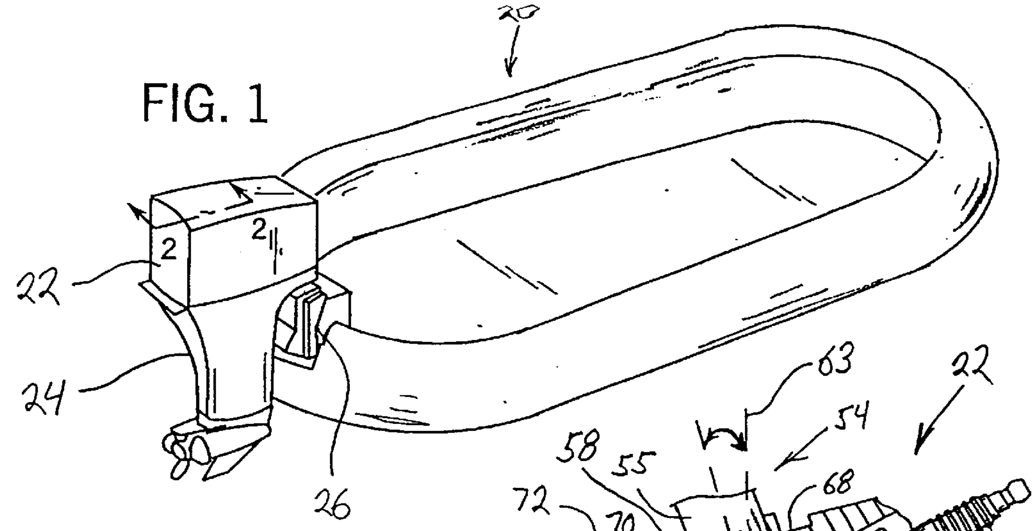
FIG. 1 is a perspective view of a watercraft powered by an exemplary engine, according to a preferred embodiment of the present invention.

Referring generally to FIG. 1, an exemplary application of the present system and methodology is illustrated. In this application, a watercraft 20, such as an inflatable boat, is powered by an engine 22 disposed in an outboard motor 24. In this embodiment, outboard motor 24 is mounted to a transom 26 of watercraft 20. Engine 22 is a two-stroke engine that is cross scavenged and utilizes a fuel injection system, as explained more fully below.

Figure 2:
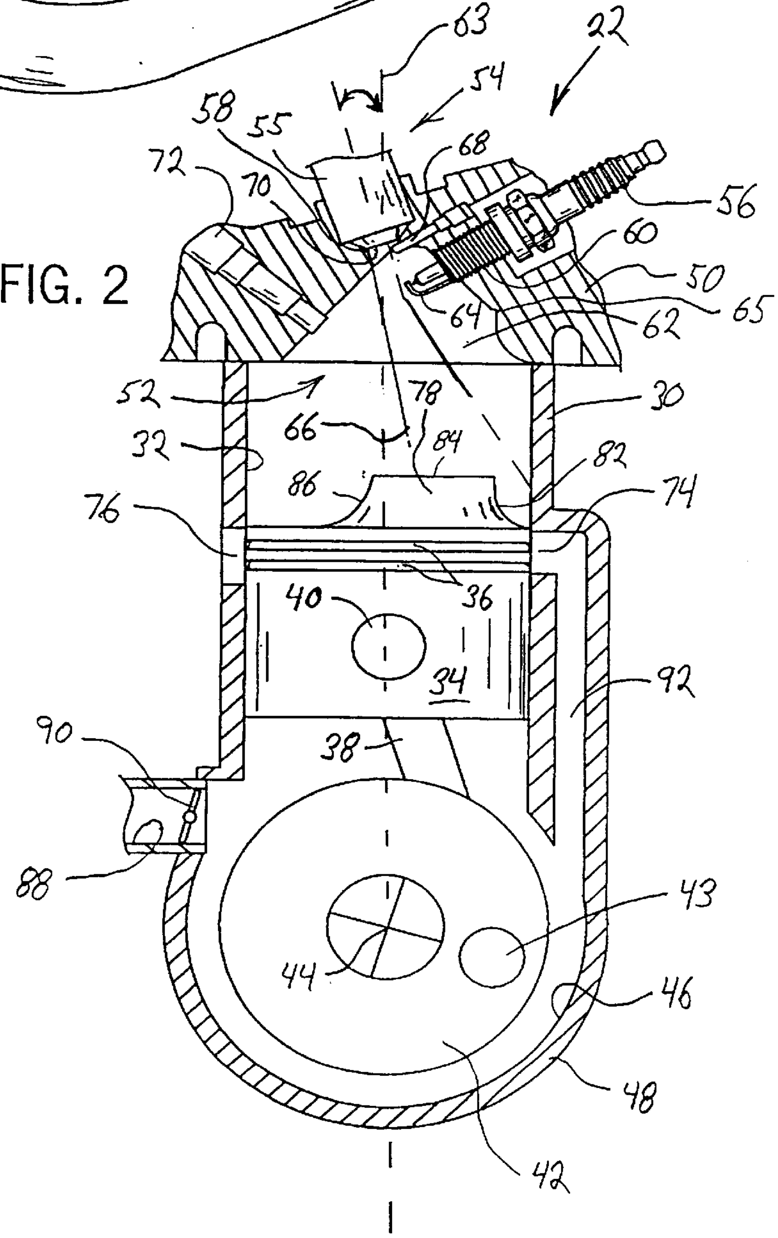
FIG. 2 is a schematic cross-sectional view of a single cylinder in an exemplary two-stroke engine that may be utilized with the watercraft illustrated in FIG. 1.
Figure 3:
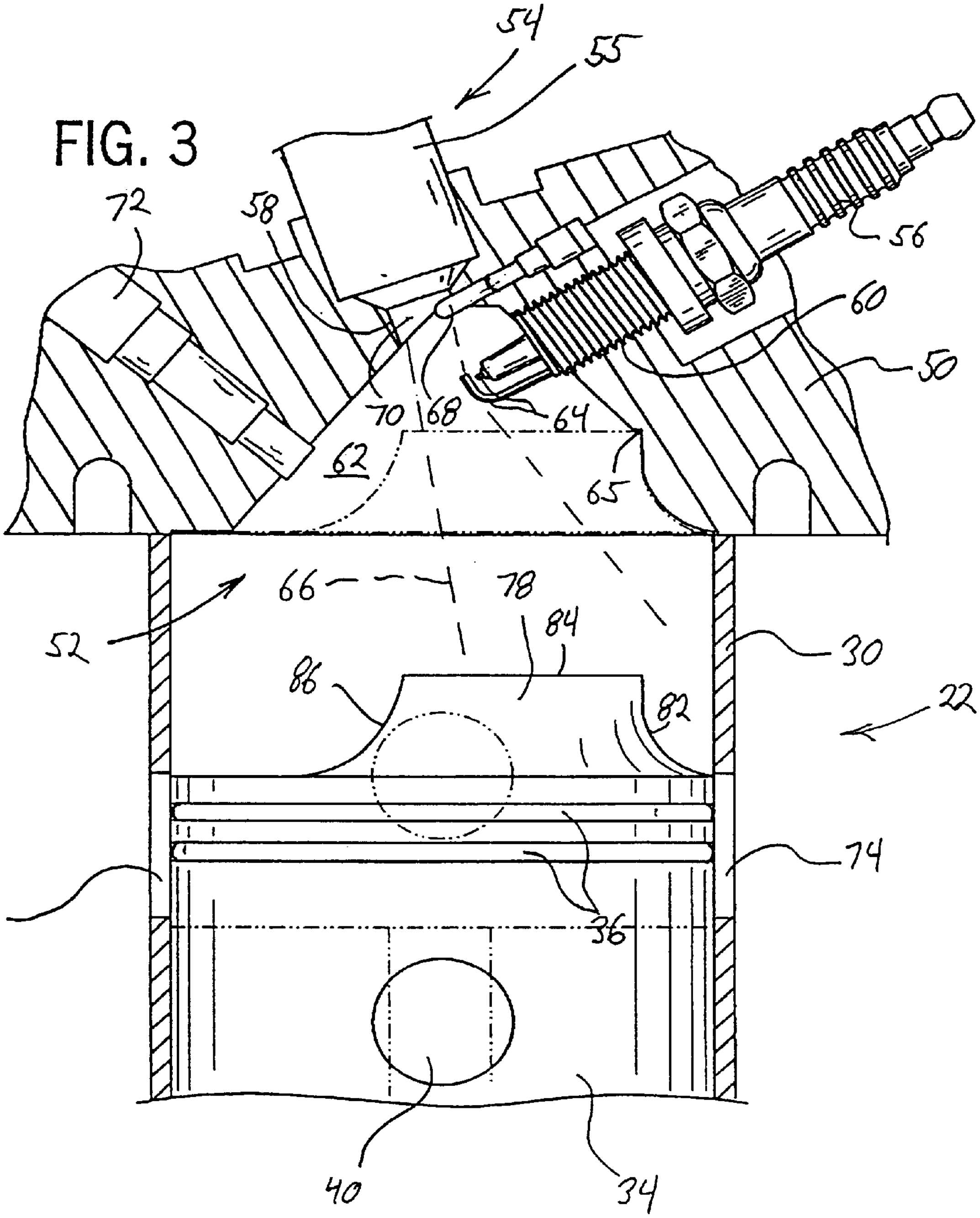
FIG. 3 is an enlarged view of the combustion chamber of the engine illustrated in FIG. 2.

Referring generally to FIGS. 2 and 3, a single cylinder of an exemplary two-stroke engine 22 is illustrated. In this embodiment, engine 22 includes at least one cylinder 30 having an internal cylinder bore 32 through which a piston 34 reciprocates. Piston 34 typically includes one or more rings 36 that promote a better seal between the piston 34 and cylinder bore 32 as piston 34 reciprocates within cylinder 30.

Piston 34 is coupled to a connecting rod 38 by a pin 40, sometimes referred to as a wrist pin. Opposite pin 40, connecting rod 38 is connected to a crankshaft 42 at a location 43 offset from a crankshaft central axis 44. Crankshaft 42 rotates about axis 44 in a crankshaft chamber 46 defined by a housing 48.

At an end of cylinder 30 opposite crankshaft housing 48, a cylinder head 50 is mounted to cylinder 30 to define a combustion chamber 52. Cylinder head 50 may be used to mount a fuel injection system 54 able to supply fuel to combustion chamber 52. In one preferred embodiment, fuel injection system 54 is a direct injection system having an injector or injector pump 55 mounted to cylinder head 50, generally above combustion chamber 52, to spray a fuel directly into the combustion chamber.

Cylinder head 50 also may be used to mount a spark plug 56 to ignite an air-fuel mixture in combustion chamber 52. Injector pump 55 and spark plug 56 are received in openings 58 and 60, respectively. Openings 58 and 60 may be formed through the wall that forms either cylinder head 50 or cylinder 30. In the illustrated embodiment, openings 58 and 60 both are formed through the wall of cylinder head 50 for communication with combustion chamber 52 within a recessed internal region 62 of cylinder head 50. Cylinder head 50 also may include a notch 65 that enhances mixing of the fuel and air.

By way of example, injector pump 55 may be generally centrally located at the top of cylinder head 50, as illustrated best in FIG. 3. In this exemplary embodiment, injector 55 is oriented at an angle with respect to the longitudinal axis 63 of cylinder 30. As illustrated, spark plug 56 also may be disposed at an angle such that its electrodes 64 are positioned in a fuel spray pattern 66 during injection of fuel into recessed region 62 of combustion chamber 52. Fuel spray pattern 66 is the "cone" or other pattern of fuel spray injected by injector pump 55.

A deflector pin 68 may be positioned such that it extends partially into fuel spray pattern 66 intermediate an injection nozzle 70 of injector pump 55 and electrodes 64 of spark plug 56. Deflector pin 68 reduces or eliminates the amount of fuel sprayed directly onto electrode 64. This, in turn, reduces the chance of fouling spark plug 56. Additionally, a combustion sensor 72, such as an oxygen sensor or knock sensor, may be positioned in communication with combustion chamber 52 within recessed region 62.

In a cross scavenged engine, cylinder 30 includes one or more intake or scavenge ports 74 and one or more exhaust ports 76. Generally, the scavenge port 74 and exhaust port 76 are disposed on generally opposite sides of cylinder 30 at a common axial or longitudinal distance along cylinder 30. The arrangement of ports makes it possible to drill the scavenge and exhaust ports directly in a single operation performed from the exhaust port side. This greatly reduces the manufacturing costs of the cross scavenged engine as compared to an equivalent loop scavenged engine. The cross scavenged cylinder also includes a deflector 78 designed to deflect air incoming through scavenge port or ports 74 for promoting mixing of air and fuel in combustion chamber 52. In the illustrated embodiment, deflector 78 is disposed on a crown 80 of piston 34. An exemplary deflector 78 includes a front deflector face or wall 82, a top region 84 and a declined region 86 generally disposed towards the exhaust port side of piston 34. Cylinder head notch 65 preferably is positioned such that it is proximate the transition between front deflector wall 82 and top region 84 when piston 34 is at top dead center.

In operation, piston 34 travels towards cylinder head 50 to compress a charge of air within combustion chamber 52. Simultaneously, injector pump 55 injects fuel to create a fuel air mixture that is ignited by an appropriately timed spark across electrode 64. As piston 34 travels towards cylinder head 50, air is drawn through an inlet port 88 into crankshaft chamber 46 and cylinder 30 on a side of piston 34 opposite combustion chamber 52. A valve 90, such as a reed valve, allows the air to pass into engine 22 but prevents escape back through inlet port 88.

Upon ignition of the fuel-air charge in combustion chamber 52, piston 34 is driven away from cylinder head 50 past exhaust port 76 through which the exhaust gasses are discharged. As piston 34 moves past exhaust port 76, scavenge port 74 is fully opened. Air from crankshaft chamber 46 is forced along a transfer passage 92 and through scavenge port 74 into cylinder 30 on the combustion chamber side of piston 34. The incoming air is deflected upwardly by deflector 78 to facilitate removal of exhaust gasses through exhaust port 76 while providing a fresh charge of air for mixing with the injected fuel. Effectively, the downward travel of piston 34 compresses the air in crankshaft chamber 46 and forces this fresh charge of air into cylinder 30 for mixing with the next charge of fuel and ignition by spark plug 56.

Preferably, the angle of injector pump 55 is selected to direct fuel spray pattern 66 generally towards the internal wall of cylinder 30 proximate scavenge port 74. This aids in the mixing of fuel and air as the incoming air, deflected upwardly by deflector 78, meets the charge of fuel injected through injection nozzle 70. In an exemplary embodiment, if the injector nozzle 70 is disposed near longitudinal axis 63 and the bore/stroke ratio is approximately 1, the angle between injector pump 55 and longitudinal axis 63 is preferably in the range from 5 to 25 degrees. Regardless of the angle, it is preferred that injector pump 55 be positioned and/or angled such that a majority of the fuel spray is directed into the hemisphere or side of cylinder 30 having scavenge port 74.

The actual amount of fuel injected and the timing of the injection can vary greatly depending on a variety of factors, including engine size, engine design, operating conditions, engine speed, etc. However, the utilization of fuel injection system 54 and the precise control over injector 55 allows the amount of fuel injected and the timing of the ignition to be carefully controlled. Also, the heat otherwise retained in piston 34 and deflector 78 is removed as fuel is sprayed onto the piston and vaporized. These factors permit increases in efficiency, fuel economy and power that would otherwise not be achievable with cross scavenged engines. The factors also permit a variety of fuels to be utilized in engine 22.

Figure 4:
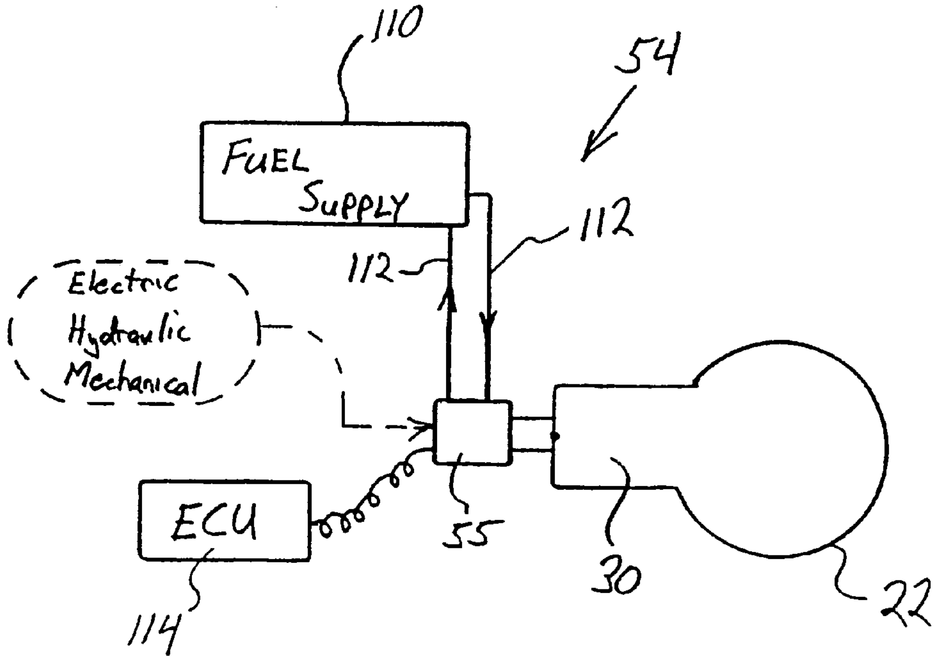
FIG. 4 is a schematic representation of an exemplary fuel delivery system utilizing a fuel-only direct injection system.
Figure 5:
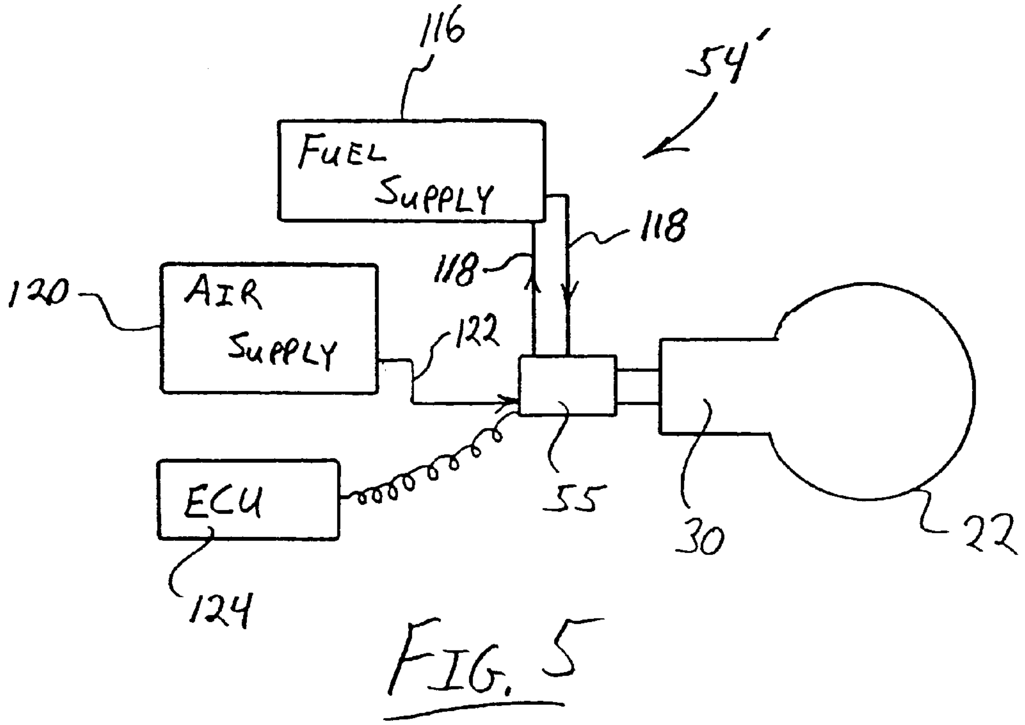
FIG. 5 is a schematic representation of an alternate fuel delivery system for direct injection of fuel and air.
Figure 6:
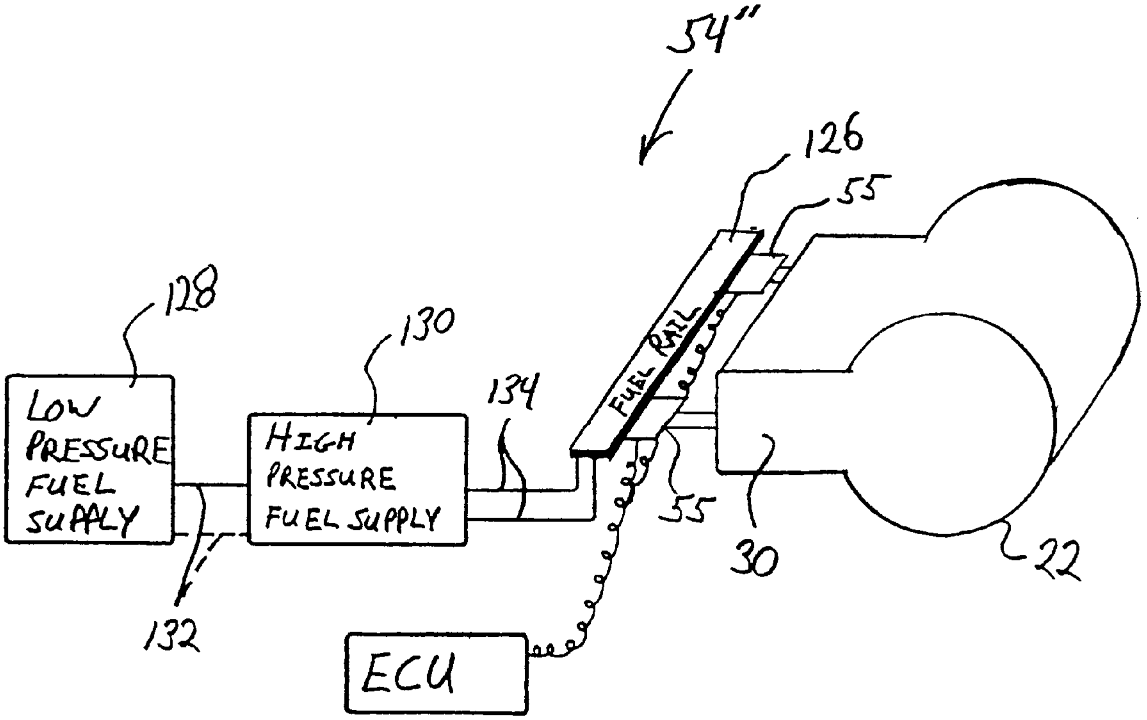
FIG. 6 is a schematic representation of an alternate fuel delivery system utilizing a fuel rail.

Referring generally to FIGS. 4 through 6, exemplary fuel injection systems 54 are illustrated. In FIG. 4, fuel injection system 54 comprises a direct fuel injection system in which only liquid fuel is directly injected into cylinder 30 of engine 22. Fuel is supplied to injector 55 via a fuel reservoir 110, e.g., a low pressure fuel supply such as a fuel tank, and fuel supply lines 112. In this embodiment, fuel injector 55 may be of a variety of injector types, including electrically, hydraulically or mechanically actuated injectors. In this type of system, a pressure pulse created in the liquid fuel forces a fuel spray to be formed at the mouth or outlet of nozzle 70 for direct, in-cylinder injection. The operation of injector 55 is controlled by an electronic control unit (ECU) 114. The ECU 114 typically includes a programmed microprocessor or other digital processing circuitry, a memory device such as an EEPROM for storing a routine employed in providing command signals from the microprocessor, and a drive circuit for processing commands or signals from the microprocessor, as known to those of ordinary skill in the art.

An alternate embodiment of fuel injection system 54, labeled 54' is illustrated in FIG. 5. In this embodiment, both fuel and air are directly injected into cylinder 30 of engine 22 by injector 55. Fuel is supplied via a fuel reservoir 116, e.g., a low pressure fuel supply such as a fuel tank, and fuel supply lines 118. Additionally, high pressure air is supplied to injector 55 via an air supply 120 and air supply line 122. Again, the activation of injector 55 is controlled by an ECU 124. In this type of system, both the air and the fuel for combustion are provided by injector 55.

Another embodiment of fuel injection system 54, labeled 54", is illustrated in FIG. 6. In this embodiment, a fuel rail 126 is utilized to supply fuel to one or more cylinders 30 of engine 22. Fuel rail 126 supply high pressure fuel to injectors 55, which are actuated between an open and a closed position to selectively permit the injection of high pressure fuel into one or more cylinders 30, as known to those of ordinary skill in the art.

In the embodiment illustrated, a low pressure fuel supply 128 provides fuel to a high pressure fuel supply 130 via appropriate fuel lines 132. High pressure fuel supply 130, in turn, supplies fuel under injection pressure to fuel rail 126 via supply lines 134.

Figure 7:
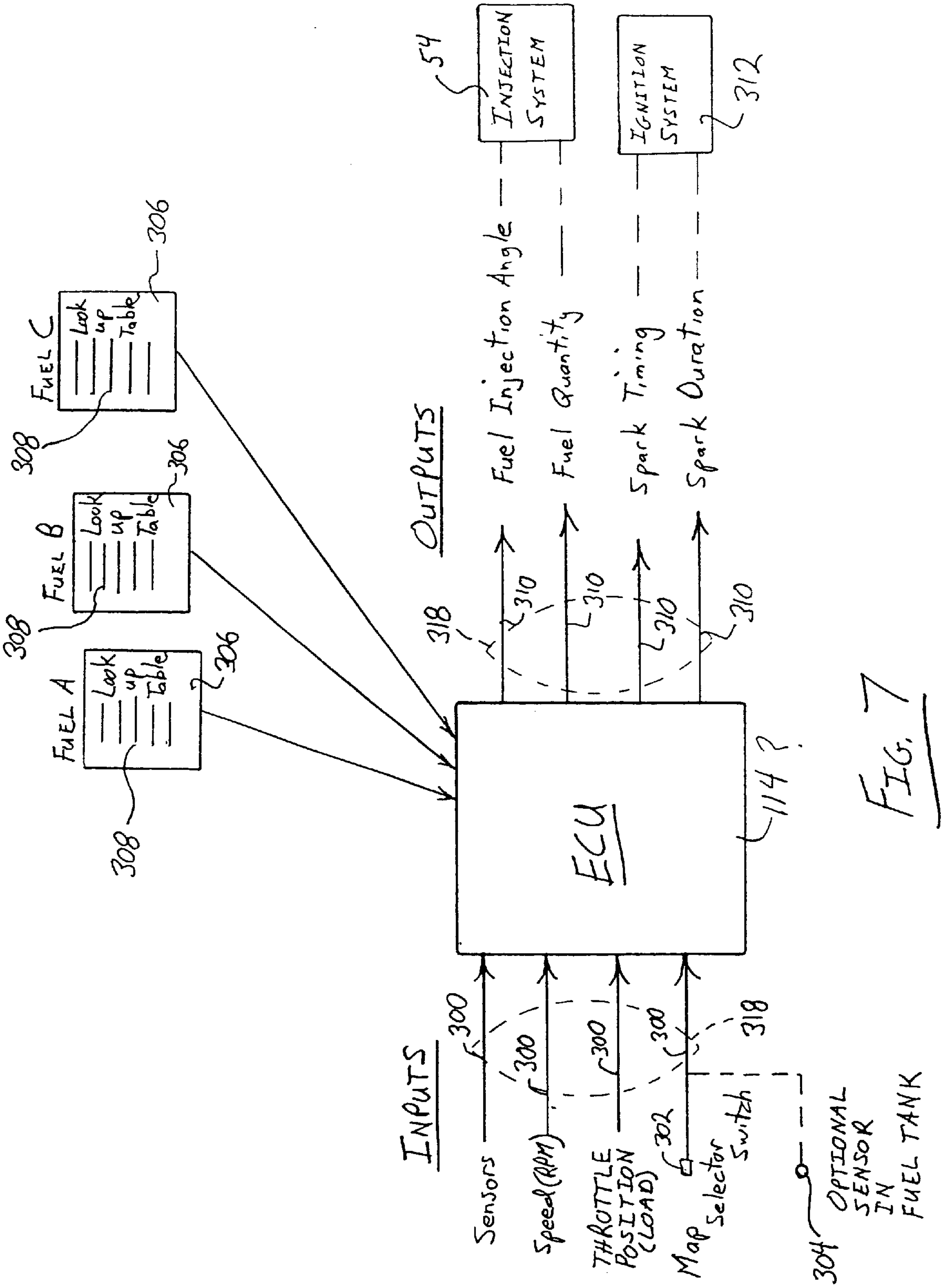
FIG. 7 is a schematic representation of an electronic control unit having a plurality of fuel maps.

Referring generally to FIG. 7, a preferred electronic control unit, e.g. ECU 114, is designed to receive a variety of inputs via a plurality of input lines 300. Input lines 300 carry input signals to the electronic control unit 114, such as signals from sensors, e.g. sensor 72. Other signals input to control unit 114 include engine speed (RPM), throttle position (load) and inputs from a fuel selector switch 302. Fuel selector switch 302 may be a simple mechanical switch having two or more positions representative of two or more fuel types that may be combusted in internal combustion engine 22. Optionally, fuel selector switch 302 may comprise a sensor 304, typically disposed in a fuel reservoir, e.g. reservoir 110. Fuel sensor 304 is able to detect the fuel type placed into the fuel tank. The sensor outputs a signal representative of the fuel type to electronic control unit 114.

Based on the input from the fuel selector switch 302, electronic control unit 114 selects a fuel map from a plurality of fuel maps 306. Each fuel map 306 corresponds to a different fuel type that may be utilized by engine 22. Exemplary fuel types include gasoline, kerosene, jet fuel, diesel and other petroleum liquid based fuels.

In the preferred embodiment, fuel maps 306 are stored in electronic control unit 114 as lookup tables 308. Each lookup table 308 is designed for the specific, selected fuel to be combusted in internal combustion engine 22. In other words, fuel maps 306 allow electronic control unit 114 to output control signals through a plurality of control lines 310 to facilitate combustion of the particular fuel type within combustion chamber 52. This unique ability to customize the control according to fuel type permits operation of engine 22 on a variety of fuels. The content of lookup tables 308 varies depending on various parameters, including fuel type, engine size, engine design and environment in which the engine is utilized, as is understood by those of ordinary skill in the art. The system also can be an active mapping system in which lookup tables are modified based on sensor (e.g., a combustion or knock sensor) feedback.

Exemplary output lines carry signals controlling the point at which fuel is injected into combustion chamber 52 (fuel injection angle) and the quantity of fuel injected into the combustion chamber. These signals are output to injection system 54 which appropriately controls the actuation of each injector 55. Other exemplary output lines provide signals to an engine ignition system 312 that controls, for instance, spark timing and spark duration at electrodes 64 of spark plug 56. Each of these controlled outputs, e.g. fuel injection angle, fuel quantity, spark timing, spark duration, may be uniquely controlled according to a specific fuel map 306 having a lookup table 308 that corresponds to the fuel type, e.g. A, B or C, of the fuel disposed in a fuel reservoir, e.g. reservoir 110.

Preferably, fuel maps 306 are designed to facilitate cold start capabilities with a variety of fuels. With kerosene, for instance, engine 22 can be difficult to start when cold. However, with direct fuel injection and a properly designed fuel map, engine 22 can be readily started and run on kerosene.

Figure 8:
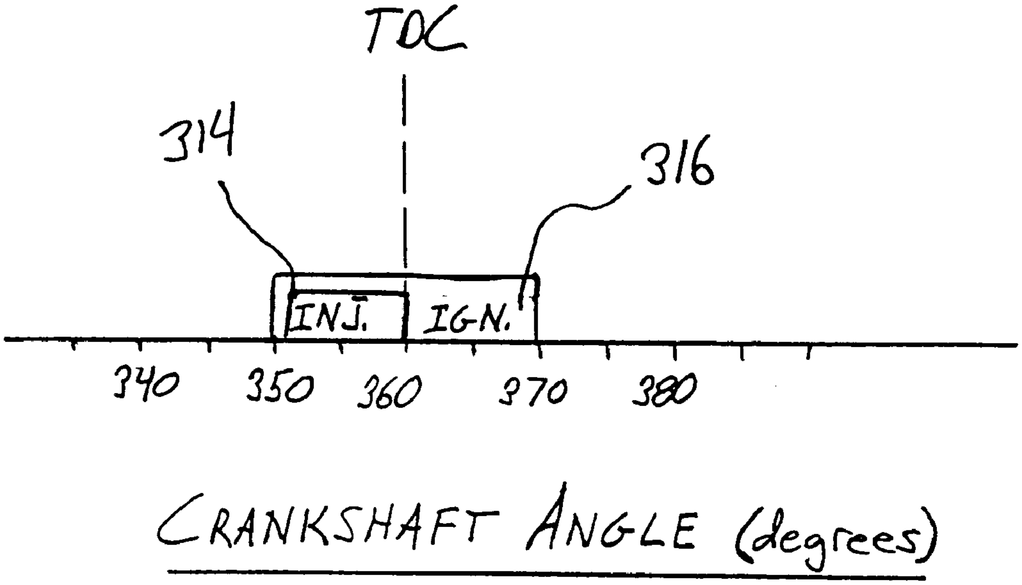
FIG. 8 is a diagram showing exemplary crankshaft angles during injection and ignition under certain engine operating conditions.

For example, under specific conditions, such as cold starts on kerosene, fuel maps 306 may be designed to inject fuel into combustion chamber 52 at or near the highest cylinder pressure near top dead center (TDC). The higher pressure creates a warmer environment that facilitates ignition. Additionally, the higher pressure facilitates atomization of the fuel as it is injected into the high pressure, warm environment. The warmer temperature and better atomization promotes better ignition and starting of engine 22. In one exemplary embodiment, fuel may be injected into combustion chamber 52 at between 0 and 10 degrees before top dead center, as illustrated by block 314 in FIG. 8.

Similarly, the ignition or spark at electrodes 64 may be controlled during starting to facilitate cold starts with a variety of fuels, e.g. kerosene. In an exemplary embodiment, a spark is established at electrodes 64 just before, during and after the piston 34 moves past TDC, as indicated by block 316 of FIG. 8. In the example provided, fuel is directly sprayed towards the spark plug gap and multiple sparks or a single long spark is initiated before the fuel reaches the spark plug electrodes. In this example, the continuous spark or multiple small sparks are formed before, during and after the injection event. In addition to directing fuel towards the spark plug electrodes, the fuel may be directed into the incoming scavenge air and areas of high charge motion, as described above, to better atomize the fuel. Also, combustion chamber 52 may be formed as a compact chamber containing the spark plug 56 and injector nozzle 70 to mechanically contain the fuel-air mixture in the immediate vicinity of spark plug 56.

In this example, the output signal to ignition system 312 may be programmed to cause multiple sparks or a single long spark at electrode 64. For example, between approximately 5 degrees before top dead center and approximately 10 degrees after top dead center, a single long spark or a plurality of sparks, e.g., 10–15 sparks, may be created across electrode 64.

Another unique feature of engine 22 is the protection provided against electromagnetic and radio frequency interference. The variety of wires and other conductors that carry input and output signals as well as electric current directed to electrode 64 of spark plug 56 can provide substantial electromagnetic interference (EMI) and radio frequency interference (RFI). In certain applications of engine 22, it is desirable to eliminate or lower the signature of the EMI and RFI.

Figure 9:
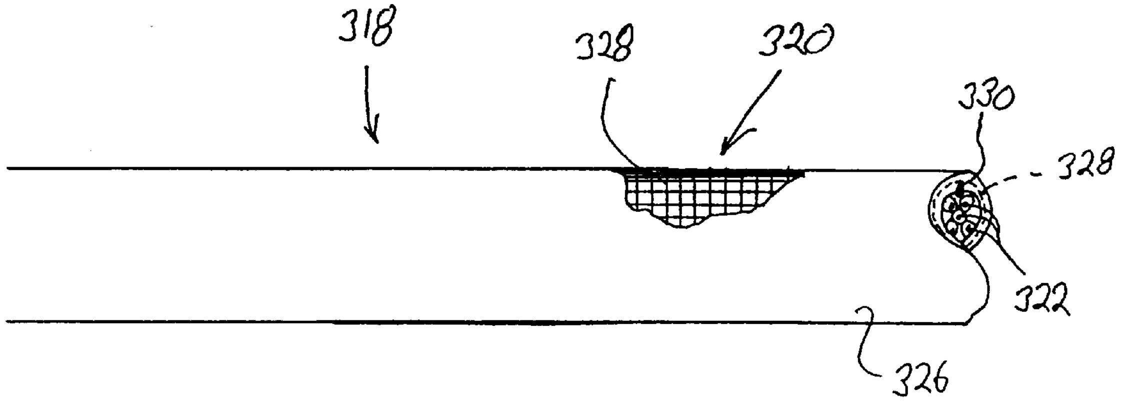
FIG. 9 is a front view of a cable bundle that limits EMI/RFI emissions.
Figure 10:
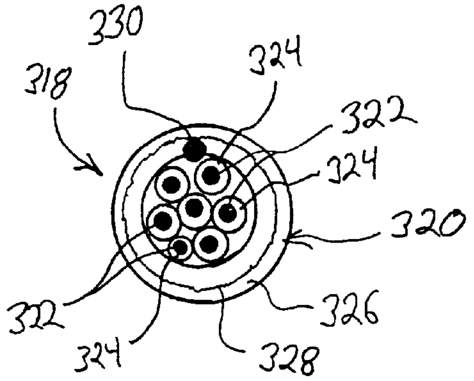
FIG. 10 is a cross-sectional view taken generally along line 10—10 of FIG. 9.

In a preferred embodiment, many of the conductive lines, such as input lines 300 and output lines 310 are bundled together in one or more wire bundles 318, as illustrated in dashed lines in FIG. 7. A variety of conductors utilized for carrying sensor signals, output control signals, and ignition currents can be bundled in one or more wire bundles 318. Preferably, each wire bundle includes an EMI/RFI signature reduction system 320, as illustrated in FIGS. 9 and 10. In one preferred embodiment, a plurality of conductive wires 322, each typically having an insulative coating 324, are bundled together and wrapped in a surrounding, insulative layer 326. An exemplary insulative layer 326 comprises a shrink tube disposed about wires 322.

Additionally, a conductive layer, preferably a conductive mesh layer 328, is disposed within insulative layer 326 surrounding wires 322, as best illustrated in FIG. 10. A bare, conductive wire 330 is squeezed between mesh layer 328 and the plurality of bundled wires 322. Each of the bare conductive wires 330 preferably is connected to a common ground. This signature reduction system effectively reduces the electromagnetic interference and radio frequency interference that would otherwise be present during operation of engine 22.

In one particular, exemplary application, engine 22 is utilized in a submersible outboard motor 24. Allowing outboard motor 24 to be submersible, particularly when combined with the multi-fuel capabilities, permits use of outboard motor 24 in a wide variety of environments, applications and geographical regions. Also, the cold-start capability and the use of precisely controlled injector pumps, as described above, permit the straightforward construction of an outboard motor 24 able to start and run dependably on one or more fuel types. This is particularly true for the two-stroke, cross scavenged engine described herein.

Figure 11:
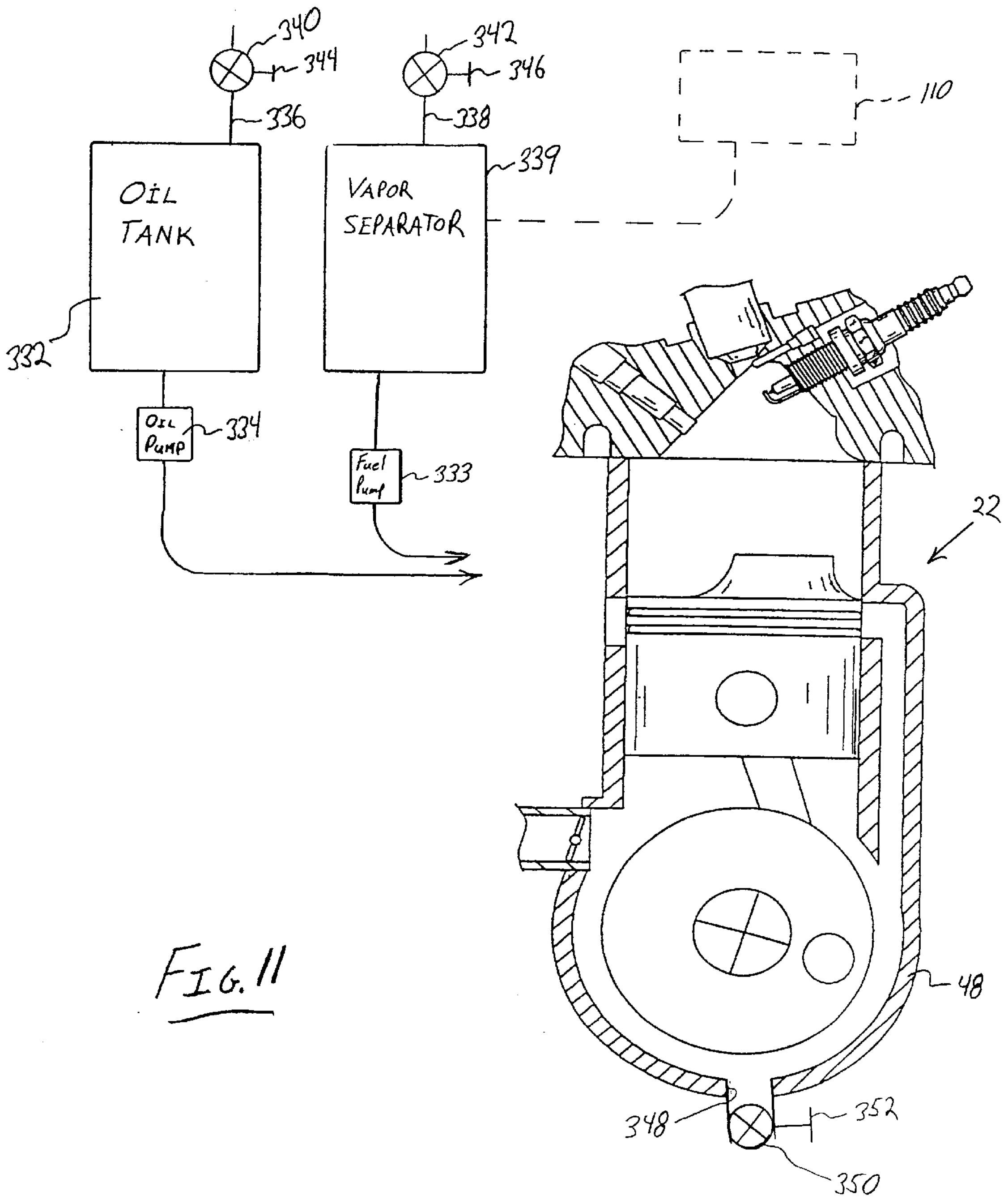
FIG. 11 is an illustration of an engine drainage system.

However, if engine 22 is submersed in water, certain portions of the engine are protected from the inflow of water while other portions are designed to permit the ready evacuation of water. For example, fuel may be delivered to injector pump 55 from fuel tank 110, and for oil injected engines, oil is delivered to engine 22 from an oil tank 332, as illustrated in FIG. 11. Fuel is typically pumped to engine 22 by an appropriate fuel pump 333 and oil is delivered from oil tank 332 to engine 22 by an oil pump 334.

Pumping of these fluids requires that the oil tank and fuel system be vented via an oil vent 336 and a fuel vent 338. Oil vent 336 may be deployed in communication with oil tank 332, and fuel vent 338 may be deployed in communication with, for example, a vapor separator 339 coupled to fuel tank 110.

A pair of valves 340, 342 are coupled to vents 336 and 338, respectively. Each valve 340 and 342 includes an actuator 344 and 346, respectively, that permits the vents to be opened or closed. Thus, prior to submersion of outboard motor 24 and engine 22, valves 340 and 342 simply are moved to a closed position. Following submersion, valves 340 and 342 are moved to an open position before engine 22 is started and operated. Exemplary valves include mechanically actuated valves that can be physically adjusted by moving actuator 344 and actuator 346 between the open and closed positions.

During submersion, cylinder 30 and crankshaft chamber 46 often intake water that must be substantially removed prior to starting the engine. Accordingly, a drainage opening 348 is formed through housing 48 generally at the lowermost portion of crankshaft chamber 46 when outboard motor 24 is mounted in a normal operating position. Drainage port 348 is coupled to a valve 350 having an actuator 352 able to move the valve 350 between an open and a closed position. Thus, when engine 22 is retrieved from its submerged location, the engine can be drained simply by opening valve 350 and allowing any water accumulated in cylinder 30 and crankshaft chamber 46 to drain through valve 350. Additionally, any water accumulated in combustion chamber 52 can be allowed to drain through passage 92 and crankshaft chamber 46. Once drained, valve 350 is moved to its closed position via actuator 352, thereby permitting the normal operation of engine 22—provided valves 340 and 342 have been opened. An exemplary valve 350 is a simple mechanical valve of the type in which actuator 352 may be physically moved between an open and a closed position.

To carry out a submersion and retrieval of outboard motor 24, valves 340 and 342 are closed to prevent water from entering areas, such as oil tank 332 and any portion of the fuel delivery system. Once retrieved, valves 340 and 342 are moved to an open position for starting and operation of engine 22. Valve 350, on the other hand, is initially opened to drain any accumulated water from the interior of engine 22. After drainage, valve 350 is closed and engine 22 is started.

It will be understood that the foregoing description is of preferred exemplary embodiments of this invention, and that the invention is not limited to the specific forms shown. For example, the fuel injection systems described are exemplary embodiments, but a variety of injection systems can be utilized with an engine, such as the cross scavenged engine described. Additionally, a variety of engine configurations, ignition systems, displacements, cylinder numbers, piston designs, scavenge port designs and exhaust port designs can be utilized. These and other modifications may be made in the design and arrangement of the elements without departing from the scope of the invention as expressed in the appended claims.

What is claimed is:

1. A low signature system, comprising:

a two-stroke engine having:

a combustion chamber;

an injector deployed in communication with the combustion chamber to discharge a fuel into the combustion chamber;

an electronic control unit in communicaton with the injector to control the discharge of the fuel; and an EMI/RFI reduction system to lower the electrognetic and radio frequency interference signature of a plurality of conductors utilized by the two-stroke engine during operation, wherein the EMI/RFI reduction system comprises:

an outer insulative layer disposed about a bundle of the plurality of conductors;

a conductive layer disposed intermediate the outer insulative layer and the bundle; and a bare, conductive wire disposed intermediate the conductive layer and the bundle.

2. The low signature engine system as recited in claim 1, wherein the conductive layer comprises a mesh layer.

3. The low signature engine system as recited in claim 1, wherein the bare conductive wire is connected to ground.

4. The low signature engine system as recited in claim 1, wherein the EMI/RFI reduction system comprises:

a second outer insulative layer disposed about a second bundle of the plurality of conductors;

a second conductive layer disposed intermediate the second outer insulative layer and the second bundle; and a second bare, conductive wire disposed intermediate the second conductive layer and the second bundle.

5. The low signature engine system as recited in claim 4, wherein the conductive layer and the second conductive layer each comprise a mesh layer.

6. The low signature engine system as recited in claim 4, wherein the bare conductive wire and the second bare conductive wire are connected to ground.

7. The low signature engine system as recited in claim 1, wherein the two-stroke engine comprises a cross-scavenged engine.

8. A method for reducing the electromagnetic and radio frequency signature of an engine having a plurality of electrical conductors, comprising:

placing at least some of the plurality of electrical conductors into a bundle; surrounding the bundle with a conductive layer;

deploying a conductive strip intermediate the bundle and the conductive layer;

grounding the conductive strip; and utilizing the plurality of electrical conductors in the engine.

9. The method as recited in claim 8, wherein the engine comprises a direct injected two-stroke engine.

10. The method as recited in claim 9, further comprising providing an insulative layer around the conductive layer.

11. The method as recited in claim 10, wherein surrounding comprises surrounding the bundle with a conductive mesh layer.

12. The method as recited in claim 11, wherein deploying comprises deploying a conductive wire longitudinally along the bundle.

13. The method as recited in claim 12, wherein placing comprises arranging the plurality of electrical conductors into a plurality of bundles.

14. The method as recited in claim 13, wherein surrounding comprises surrounding each bundle with a conductive mesh layer.

15. The method as recited in claim 14, wherein deploying comprises deploying a conductive wire intermediate each of the bundles and the conductive mesh layer surrounding the bundle.

16. The method as recited in claim 15, wherein grounding comprises grounding each conductive wire.

17. A system for reducing the electromagnetic and radio frequency signature of an engine having a plurality of electrical conductors, comprising:

means for placing at least some of the plurality of electrical conductors into a bundle for use by a two-stroke engine;

means for surrounding the bundle with a conductive layer;

means for deploying a conductive strip intermediate the bundle and the conductive layer; and means for grounding the conductive strip.

18. The system as recited in claim 17, further comprising means for directly injecting a fuel into the two-stroke engine.

19. A method for making an engine having a reduced electromagnetic and radio frequency signature, comprising:

providing a two-stroke engine having a combustion chamber;

injecting a fuel directly into the combustion chamber during operation; and limiting the electromagnetic and radio frequency interference by providing a grounded EMI/RFI barrier around a plurality of electrical conductors.

20. The method as recited in claim 19, wherein limiting comprises surrounding the plurality of conductors with a conductive layer.

21. The method as recited in claim 20, wherein surrounding comprises surrounding the plurality of conductors with a conductive mesh layer.

22. The method as recited in claim 21, wherein limiting comprises deploying a conductive wire longitudinally between the conductive mesh layer and the plurality of conductors.

23. The method as recited in claim 22, wherein limiting further comprises providing an insulative layer about the conductive mesh layer.

* * * * *